United States Patent [19]
Miyake et al.

[11] Patent Number: 6,038,279
[45] Date of Patent: *Mar. 14, 2000

[54] X-RAY GENERATING DEVICE, AND EXPOSURE APPARATUS AND SEMICONDUCTOR DEVICE PRODUCTION METHOD USING THE X-RAY GENERATING DEVICE

[75] Inventors: Akira Miyake, Utsunomiya; Masami Tsukamoto, Yokohama, both of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/730,999

[22] Filed: Oct. 16, 1996

[30] Foreign Application Priority Data

Oct. 16, 1995 [JP] Japan .................... 7-267029
Oct. 20, 1995 [JP] Japan .................... 7-272727

[51] Int. Cl.[7] .................................... G21K 5/00
[52] U.S. Cl. ............................... 378/34; 378/122
[58] Field of Search .................... 378/34, 35, 122

[56] References Cited

U.S. PATENT DOCUMENTS

| | | | |
|---|---|---|---|
| 4,484,339 | 11/1984 | Mallozzi | 378/34 |
| 4,896,341 | 1/1990 | Forsyth | 378/34 |
| 5,394,451 | 2/1995 | Miyake et al. | 378/34 |
| 5,444,758 | 8/1995 | Miyake et al. | 378/113 |
| 5,503,950 | 4/1996 | Miyake et al. | 430/5 |
| 5,581,605 | 12/1996 | Murakami et al. | 378/34 |

*Primary Examiner*—Craig E. Church
*Attorney, Agent, or Firm*—Fitzpatrick, Cella, Harper & Scinto

[57] ABSTRACT

An X-ray generating device employing a laser-excited plasma light source has a plurality of luminescent points, or a luminescent portion the form of which is variable in terms of the configuration, size, position and the number of luminescent points. An object such as a mask is illuminated by X-rays generated from the light source under Köhler's illumination conditions. Also disclosed are an X-ray generating method using such a device, as well as a method of producing a semiconductor device.

45 Claims, 10 Drawing Sheets

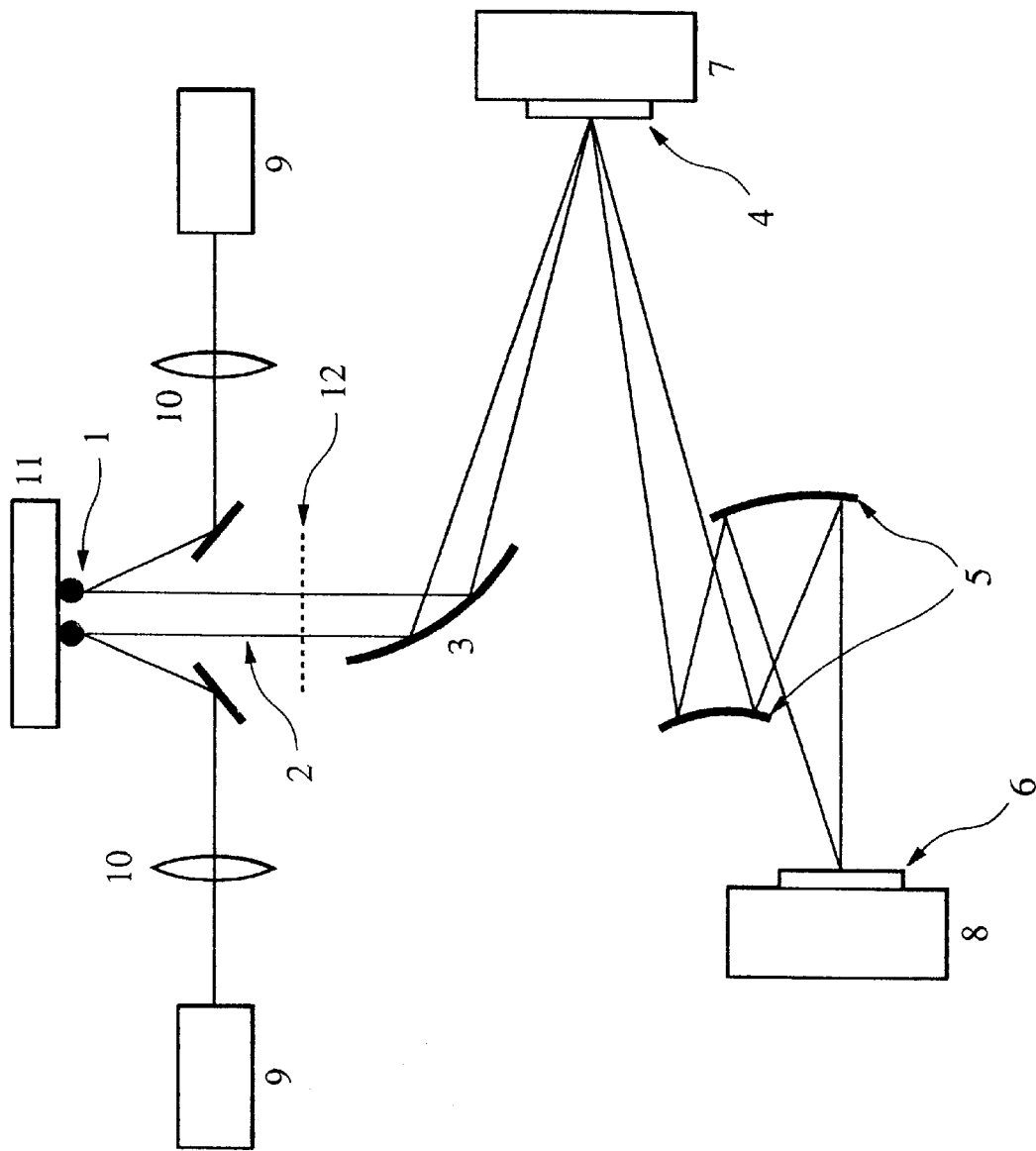

X-RAY GENERATING DEVICE, AND EXPOSURE APPARATUS AND SEMICONDUCTOR DEVICE PRODUCTION METHOD USING THE X-RAY GENERATING DEVICE

BACKGROUND OF THE INVENTION

1. Field of the Invention

The present invention relates to X-ray apparatuses, suitable for use in exposure systems, as well as in semiconductor device production.

2. Description of the Related Art

A method known as an X-ray demagnification (reduced magnification) projection exposure method has been suitably used in the production of devices having fine patterns, such as semiconductor circuit elements. According to this method, a mask carrying a circuit pattern formed thereon is illuminated with X-rays so that the mask image, i.e., the circuit pattern, is projected at a prescribed demagnification onto a wafer surface so that a resist on the wafer surface is exposed, whereby the circuit pattern is transferred to the resist in a reduced scale.

FIG. 10 shows an example of a conventional X-ray demagnification projecting exposure apparatus. This apparatus has, as its major components, an X-ray source 109, 110, 101, 111, an illuminating optical system 103, a reflective mask 104, a projection optical system 105, a stage 108 carrying a wafer 106, an alignment mechanism (not shown) for precisely aligning the positions of the mask 104 and the wafer 106, and a vacuum vessel and evacuating system (not shown) which cooperate with each other in maintaining a vacuum atmosphere around the entire optical system so as to prevent attenuation of t he X-rays.

Laser-excited plasma, for example, is used as the X-ray source. A laser source 109 emits laser beam in the form of pulses, which hit a target 111 so that laser plasma is generated. X-rays emitted from a luminescent point 101 of the laser plasma are collected on the reflective mask 104 through a collecting lens (not shown). The luminescent point 101 of the laser plasma has a size on the order of several hundreds of $\mu$m and, hence, can be regarded as being a point source. The X-rays 102 emitted from the luminescent point 101 pass through filter 112 and are collimated by a parabolic mirror 103 having a focal point located on the luminescent point 101. The projection optical system 105 includes a plurality of multi-layered reflective mirrors which demagnify (reduce the magnification of) the pattern on the mask 104 so as to project the pattern image of a reduced size on the surface of the wafer 106. The projection optical system 105 is usually constituted by a telecentric system.

Conventional X-ray demagnifying projection exposure apparatuses, however, have suffered from the following problems.

Namely, these conventional apparatuses could not provide resolution and focal depth which would be sufficient for projecting extremely delicate and fine patterns on masks onto wafers, thus failing to transfer such patterns with a desired high degree of precision. In order to obviate this problem, it has been proposed to improve the image forming performance by using a phase shift effect offered by a phase shift mask. However, it has been impossible to fully enjoy the effects of such a phase shift mask. These problems encountered with conventional devices are attributable to the following reasons.

One of the characteristic parameters of an illuminating system is a coherence factor $\sigma$. The coherence factor $\sigma$ is expressed as follows, representing the mask-side numerical aperture of the projection optical system by $NA_{p1}$ and that of the illuminating optical system by NAi:

$$\sigma = NAi/NA_{p1}.$$

The optimum value of the coherence factor $\sigma$ is determined based on the levels of resolution and contrast required in the transfer of the pattern. In general, a too small value of the coherence factor $\sigma$ allows an interference pattern to appear at edges of the fine pattern image projected on the wafer, while a too large coherence factor $\sigma$ reduces the contrast of the projected image.

An illumination system having a coherence factor $\sigma$ of 0 (zero) is referred to as a "coherent illumination system". Such a coherent illumination system exhibits a constant optical system transfer factor (OTF) when the spatial frequency does not exceed a value given by $NA_{p2}/\lambda$ where $NA_{p2}$ and $\lambda$ respectively indicate the wafer-side numerical aperture of the projection optical system and the wavelength of the X-rays. However, at higher spatial frequencies, the transfer factor OTF is zero, so that resolution of the image is impossible. In contrast, an illumination system having a coherence factor of 1 is referred to as an "incoherent illumination system". In this type of an illumination system, the transfer factor OTF decreases in accordance with an increase in the spatial frequency, but is not reduced to zero until the spatial frequency reaches a value which is given as $2 \times NA_{p2}/\lambda$. Thus, resolution is possible to a greater degree of fineness as compared with the coherent illuminating system. The conventional X-ray demagnifying projection exposure apparatuses, however, are designed such that the coherence factor $\sigma$ approximates 0 and, hence, operate under substantially coherent illuminating conditions. These apparatuses, therefore, have limited resolution and cannot transfer patterns having a high degree of fineness.

SUMMARY OF THE INVENTION

Accordingly, it is an object of the present invention to provide an X-ray generating apparatus and method capable of providing improved image forming performance over conventional devices, as well as a high-performance exposure apparatus and an improved device production method which make use of such an X-ray generating apparatus and method.

To this end, according to a preferred form of the present invention, a light source is provided in the form of an aggregate of a plurality of luminescent points and X-rays emitted from these luminescent points are collected through an illuminating optical system so as to effect Köhler's-illumination on an object such as a mask. X-rays emitted from different luminescent points of the source impinge upon the mask at different incident angles. Therefore, when the entire light source composed of an aggregate of luminescent points has a finite size, the X-rays illuminating the mask also have a finite angular divergence. Furthermore, when the source has a non-uniform luminescent intensity distribution, the X-rays illuminating the mask also have a correspondingly non-uniform angular distribution, thus realizing modified illumination.

The X-ray source composed of a plurality of luminescent points can be realized by applying a plurality of laser beams onto a plurality of points on a target. Alternatively, a laser beam from a single laser source is deflected so as to impinge upon a plurality of points on the target in a time-series manner. The detail of the methods of creating such an X-ray source will be described later in connection with the description of the preferred embodiments.

Thus, the use of an aggregate of a plurality of luminescent points as the source of the X-rays makes it possible to widen the angular distribution of the X-rays illuminating a mask so as to provide a greater value of the coherence factor σ, and to achieve modified illumination such as ring illumination, oblique illumination and so forth. It is therefore possible to improve the image forming performance in terms of resolution and focal depth. When a phase shift mask is used, it is possible to make full use of the effect to improve the image forming performance offered by such a mask.

In another preferred form of the present invention, an area X-ray source of finite size is used as the X-ray source. The X-rays emitted from this area source are collected on an object such as a mask through an illuminating optical system, thus effecting Köhler's-illumination on such an object. X-rays emitted from different points on the planar source irradiate the mask at different angles. Since the area X-ray source has a finite size, the X-rays illuminating the mask also have a correspondingly finite angle of divergence value. It is possible to vary the coherence factor by varying the form of the X-ray generating section, i.e., the configuration, size and position of the source. The planar X-ray source may have a non-uniform luminescent intensity distribution. In such a case, the X-rays illuminating the mask have a non-uniform angular distribution, thus realizing a modified illumination.

It is thus possible to optimize the coherence factor σ of the illumination system and to achieve modified illumination such as ring illumination or oblique illumination, by controlling the angular distribution of the X-rays illuminating the mask, by suitably setting the form of the X-ray source. Consequently, illuminating conditions can be optimized in accordance with the conditions of the exposure to be performed, contributing to improvement in the image forming performance in terms of resolution and focal depth.

In one aspect, the present invention provides an X-ray generating device comprising a laser source for generating a laser beam and a plurality of points on a target for receiving the laser beam and for generating X-rays from portions of high temperature plasma on the target.

In another aspect, the present invention provides an X-ray generating device comprising a laser source for generating a laser beam, an aperture, having a variable shape, for receiving the laser beam and for defining a secondary laser beam and a target for receiving the secondary laser beam and for generating X-rays from portions of high temperature plasma on the target.

In yet another aspect, the present invention provides an X-ray irradiating apparatus comprising (i) an X-ray generating device comprising a laser source for generating a laser beam and a plurality of points on a target for receiving the laser beam and for generating X-rays from high temperature plasma on the target, and (ii) irradiating means for irradiating an object with the X-rays generated by the X-ray generating device.

In yet another aspect, the present invention provides an X-ray irradiating apparatus comprising (i) an X-ray generating device comprising a laser source for generating a laser beam, an aperture, having a variable shape, for receiving the laser beam and for defining a secondary laser beam and a target for receiving the secondary laser beam and for generating X-rays from portions of high temperature plasma on the target, and (ii) irradiating means for irradiating an object with the X-rays generated by the X-ray generating device.

In still another aspect, the present invention provides an X-ray generating method including generating at least one laser beam from at least one laser source, providing a plurality of points on a target for receiving the at least one laser beam and generating X-rays from portions of high temperature plasma on the target.

In still another aspect, the present invention provides an X-ray generating method comprising generating a laser beam from a laser source, providing an aperture, having a variable shape, for receiving the laser beam and for defining a secondary laser beam, providing a target for receiving the secondary laser beam and generating X-rays from portions of high temperature plasma on the target.

In yet another aspect, the present invention provides a method of producing a semiconductor device, and includes steps of generating at least one laser beam from at least one laser source, providing a plurality of points of high temperature plasma on a target for receiving the at least one laser beam, generating X-rays from the points on the target, irradiating a mask with the X-rays from the portions and projecting an image of the pattern carried by the irradiated mask onto a wafer.

In still another aspect, the present invention provides a method of producing a semiconductor device, and includes steps of generating a laser beam from a laser source, providing an aperture, having a variable shape, for receiving the laser beam and for defining a secondary laser beam, providing a target for receiving the secondary laser beam, generating X-rays from portions of high temperature plasma on the target, irradiating a mask with X-rays from the portions and projecting an image of a pattern carried by the irradiated mask onto a wafer.

The present invention can be applied to a wide variety of apparatuses which need illumination or irradiation with X-rays, such as, for example, an X-ray exposure apparatus, X-ray microscopes, X-ray examination apparatus, X-ray processing apparatus, and clinical X-ray apparatuses.

The above and other objects, features and advantages of the present invention will become clear from the following description of the preferred embodiments.

BRIEF DESCRIPTION OF THE DRAWINGS

FIG. 1 is a diagrammatic illustration of an embodiment of the present invention.

DESCRIPTION OF THE PREFERRED EMBODIMENTS

<First Embodiment>

Figure 2A:
FIGS. 2(A) to 2(E) are illustrations of different distribution patterns of a plurality of luminescent points constituting an X-ray source.

Referring to FIG. 1, showing a first embodiment of the present invention, an exposure apparatus has the following major components: a plurality of YAG laser units 9; a plurality of laser beam collecting optical systems 10; a laser plasma target 11; a filter 12; a paraboloid-of-revolution reflective mirror 3; a reflective mask 4 and a mask stage 7 carrying the reflective mask 4; a projection optical system 5; a wafer 6 with a resist applied thereto; and a wafer stage 8 carrying the wafer 6. The reflective mask 4 has a multi-layered reflective mirror on which a pattern to be transferred has been formed with a material capable of absorbing X-rays. The reflective mask 4 may be a phase shift mask having steps formed in a multi-layered film in accordance with the pattern.

Laser beams emitted from the respective YAG lasers 9 are focused on different points 1 on the target 11 through the laser beam focusing optical systems 10 so as to generate plasmas of high temperature, each of which generates X-rays 2. Each laser beam focusing optical system 10 has a zooming (reduced magnification) or defocus function and, hence, is capable of controlling the positions and sizes of a laser beam spot formed on the target 11.

The projection optical system 5 is constituted by a pair of aspherical reflective mirrors each having a multi-layered film on its reflective surface. A telecentric system is used as the projection optical system 5. The image-side numerical aperture $NA_{P2}$ of this optical system is determined based on the wavelength $\lambda$ of the X-rays and other factors such as the required levels of resolution and focal depth. The numerical aperture generally ranges from 0.05 to 0.2. For instance, when the image-side numerical aperture $NA_{P2}$ is set to be 0.1, while the projection magnification is 1/5, the numerical aperture $NA_{P1}$ at the same side as the object, i.e., the mask, is 0.02.

The paraboloid-of-revolution reflective mirror 3 has a multi-layered film or a single metallic film, and is disposed such that its focal point is located at the position of the laser plasma target 11 which serves as the light source. Therefore, the X-rays emitted from a certain point on the plane of the light source are reflected by the paraboloid-of-revolution reflective mirror 3 so as to become a collimated beam which irradiates the entire area of the mask 4. Similarly, the X-rays emitted from another point on the plane of the light source are collimated to irradiate the entire area of the mask 4. The projection optical system 5 employs a telecentric system and, therefore, satisfies the conditions of Köhler's illumination.

The X-rays from different points on the light source plane impinge upon the mask at different angles. More specifically, X-rays from two points assumed on the light source plane at a distance "d" from each other, incident on a certain point on the mask, form therebetween an angle d/f (rad.), where "f" indicates the focal length of the paraboloid-of-revolution reflective mirror 3. Representing the size of the whole light source constituted by the plurality of luminescent points by "D", the angle of divergence of the rays illuminating the mask is determined as D/f (rad.). The numerical aperture NAi of the illuminating system is therefore determined as D/(2×f).

In this case, the coherence factor σ is expressed as $\sigma = D/(2 \times f \times NA_{P1})$. It is possible to obtain a coherence factor of 1.0, i.e., incoherent illumination, when the size D of the light source is set to be 8 mm while the focal length f and the numerical aperture $NA_{P1}$ are 200 mm and 0.02, respectively.

The embodiment described hereinbefore employs a plurality of plasma-exciting laser sources 9 and a plurality of laser beam focusing optical systems 10, so that a plurality of plasma X-ray luminescent points 1 are concurrently formed on the target. In addition, the sizes of the luminescent points are controlled through independent controls of the zooming or defocus functions of the laser beam focusing optical systems, thus enabling setting of any desired configuration of the luminescent portion of the light source.

Figure 2B:
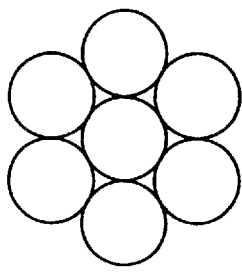
Figure 2C:
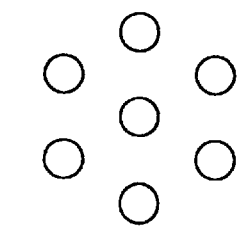
Figure 2D:
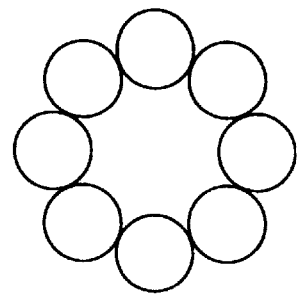
Figure 2E:
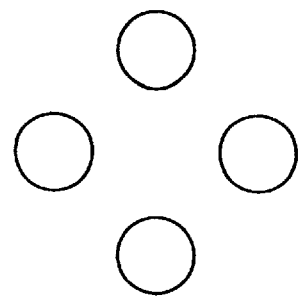

FIGS. 2(A) to 2(E) show, by way of examples, various configurations of the luminescent portion of the light source. The size D of the whole light source is small when small laser beam spots are superposed, as shown in FIG. 2(A), so that the coherence factor σ approaches 0 to realize coherent illumination. Conversely, when large laser beam spots are formed, so as not to overlap, as shown in FIG. 2(B), the effective size D of the whole light source is increased to make the coherence factor σ approach 1, whereby illuminating conditions approximating those of incoherent illumination are realized. For instance, when the luminescent points are uniformly distributed in a circular area of 8 mm in diameter, the coherence factor σ is set to σ=1.0, thus providing incoherent illumination. FIG. 2(C) shows a pattern in which small laser beam spots are arranged apart from one another. This arrangement also provides a large size effective light source, thus realizing substantially coherent illumination. It is also possible to provide a modified illumination such as oblique illumination or ring illumination by controlling the form of the luminescent portion. Namely, by arranging the laser beam spots around a circle or with intervals as shown in FIG. 2(D) or FIG. 2(E), it is possible to modify the uniform angular distribution of the X-rays incident on the mask into a non-uniform distribution, thus enabling factors such as resolution, focal depth and so forth to be controlled to achieve higher image forming performance.

<Second Embodiment>

Figure 3:
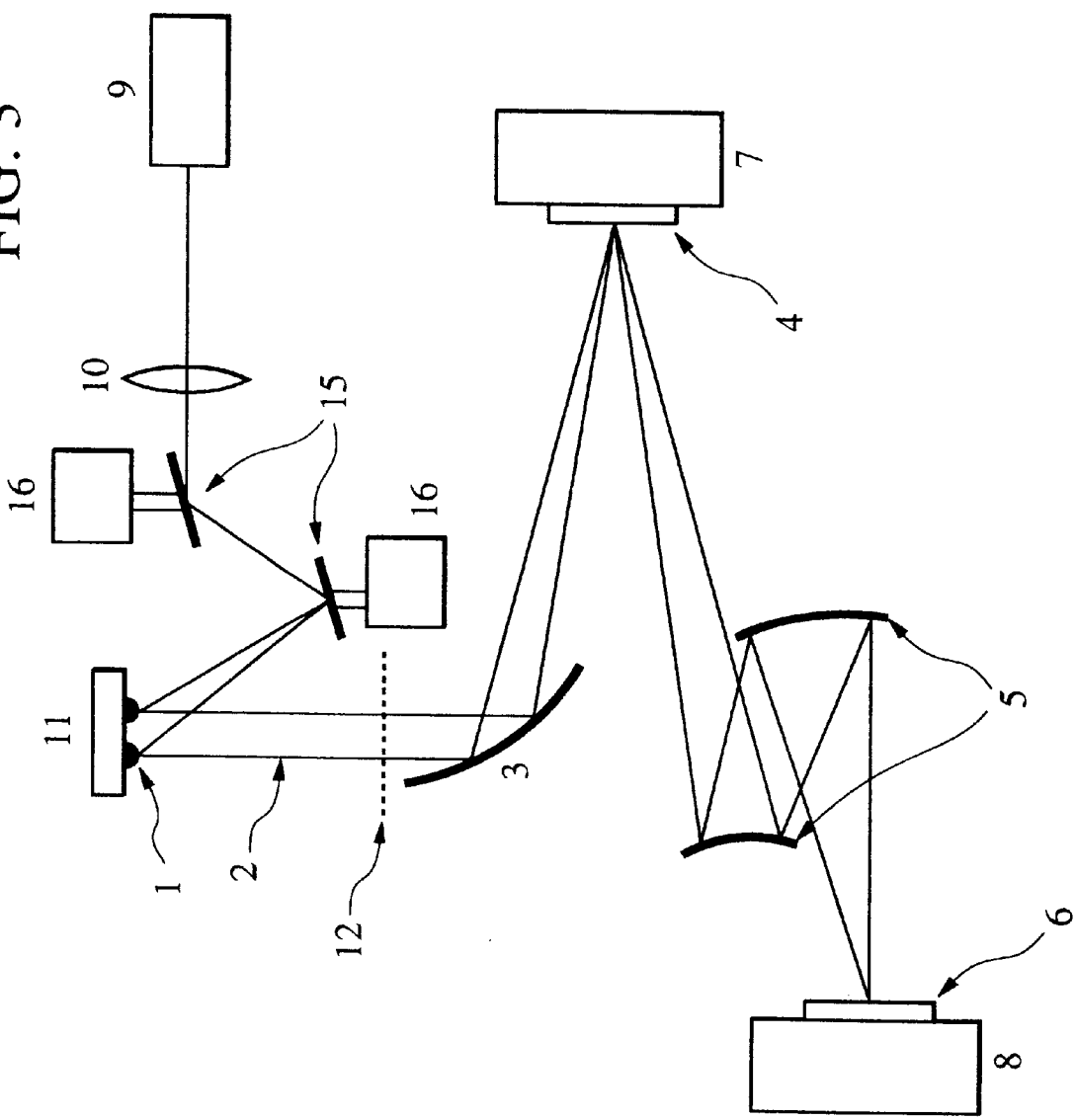
FIG. 3 is a diagrammatic illustration of a second embodiment of the present invention.

FIG. 3 illustrates a second embodiment of the present invention. The second embodiment is different from the first embodiment in that it employs, as means for generating a plurality of luminescent points, a pair of laser beam deflector mirrors 15 (composed of a pair of reflection mirrors) and their associated actuators 16.

The laser beam from a laser source 9 is focused through the laser beam focusing optical system 10 onto a target 11, thereby generating high-temperature plasma which emits X-rays 2. The position of the incident point 1 on the target 11 is two-dimensionally controlled by the operation of the pair of deflection mirrors 15 actuated by their actuators 16. The illuminating timing of the laser source 9 is controlled in accordance with a signal from a control system (not shown) for controlling the actuators, indicative of the position to which the deflected beam is to be directed. More specifically, the reflection mirrors of the deflection mirrors 15 are actuated so that the laser beam is directed to a predetermined point to be illuminated and, when the angles of the reflection mirrors have been set to aim the laser beam to such a predetermined point, the laser is actuated to emit the laser beam. It is thus possible to freely control the number and positions of the laser-excited plasma luminescent points 1. In this embodiment, the projection optical system 5 includes a pair of aspherical reflective mirrors and constitutes a non-telecentric system. The reflective surface of each reflective mirror has a multi-layered film. The paraboloid-of-revolution reflective mirror 3 is disposed such that the laser plasma target 11 serving as the light source is located on a first focal point thereof, while the entrance pupil of the projection optical system 5 is located on a second focal point thereof. Therefore, the X-rays emitted at a certain moment are reflected by the paraboloid-of-revolution mirror 3 so as to illuminate the entire area of the mask 4. Similarly, the X-rays emitted at another moment from another point on the light source plane illuminate the entire area of the mask 4. Thus, the X-rays emitted from different points of the light source plane at different moments impinge upon the mask at different angles. The distribution of the luminescent points 1 of the light source corresponds to the distribution of angles of the X-rays incident on a common point on the mask.

In the second embodiment described above, it is possible to provide a modified illumination such as oblique illumination or ring illumination, through variation of the form of the luminescent portion of the light source, by controlling the position of illumination by the exciting laser beam. For instance, it is possible to change the uniform angular distribution of the X-rays incident on the mask into a non-uniform distribution, enabling factors such as resolution, focal depth and so forth to be controlled to achieve higher image forming performance, by arranging the laser beam spots along a circle or arranging these spots in a discrete manner.

Figure 4:
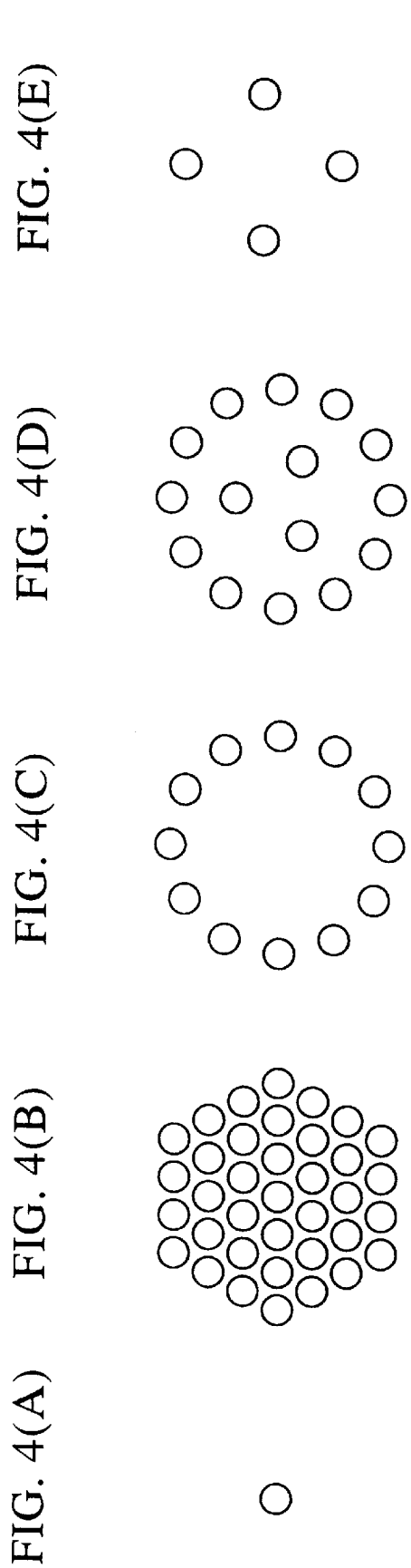
FIGS. 4(A) to 4(E) are illustrations of different distribution patterns of a plurality of luminescent points of an X-ray source.

FIGS. 4(A) to 4(E) show different patterns of illumination with the laser beam. A small circular luminescent point is obtained to provide a condition approximating that of coherent illumination, when the laser beam is applied only to a single point as shown in FIG. 4(A). In contrast, a large luminescent point is obtained to provide a condition approximating that of incoherent illumination, when the beam spots are uniformly applied two-dimensionally as illustrated in FIG. 4(B). A luminescent point in the form of a ring is obtained to provide ring illumination, when the laser beam is applied successively along a ring-shaped area as shown in FIG. 4(C). FIG. 4(D) shows a spot distribution pattern which is obtained when the laser beam is applied to a circular area and also to an area inside the circular area at a reduced spot density. FIG. 4(E) shows a pattern in which the laser beam is applied successively to four points. This pattern provides discrete luminescent points so as to realize oblique illumination.

The second embodiment described above employs a single laser source and the laser light emitted from this source is deflected two-dimensionally while the timing of emission of the laser light from the laser source is controlled in synchronization with the deflecting operation, whereby a plurality of X-ray luminescent points are generated in a time-series manner so as to provide a desired form of the luminescent portion of the X-ray source. The size of the X-ray generating device can therefore be reduced because only one laser source suffices.

<Third Embodiment>

Figure 5:
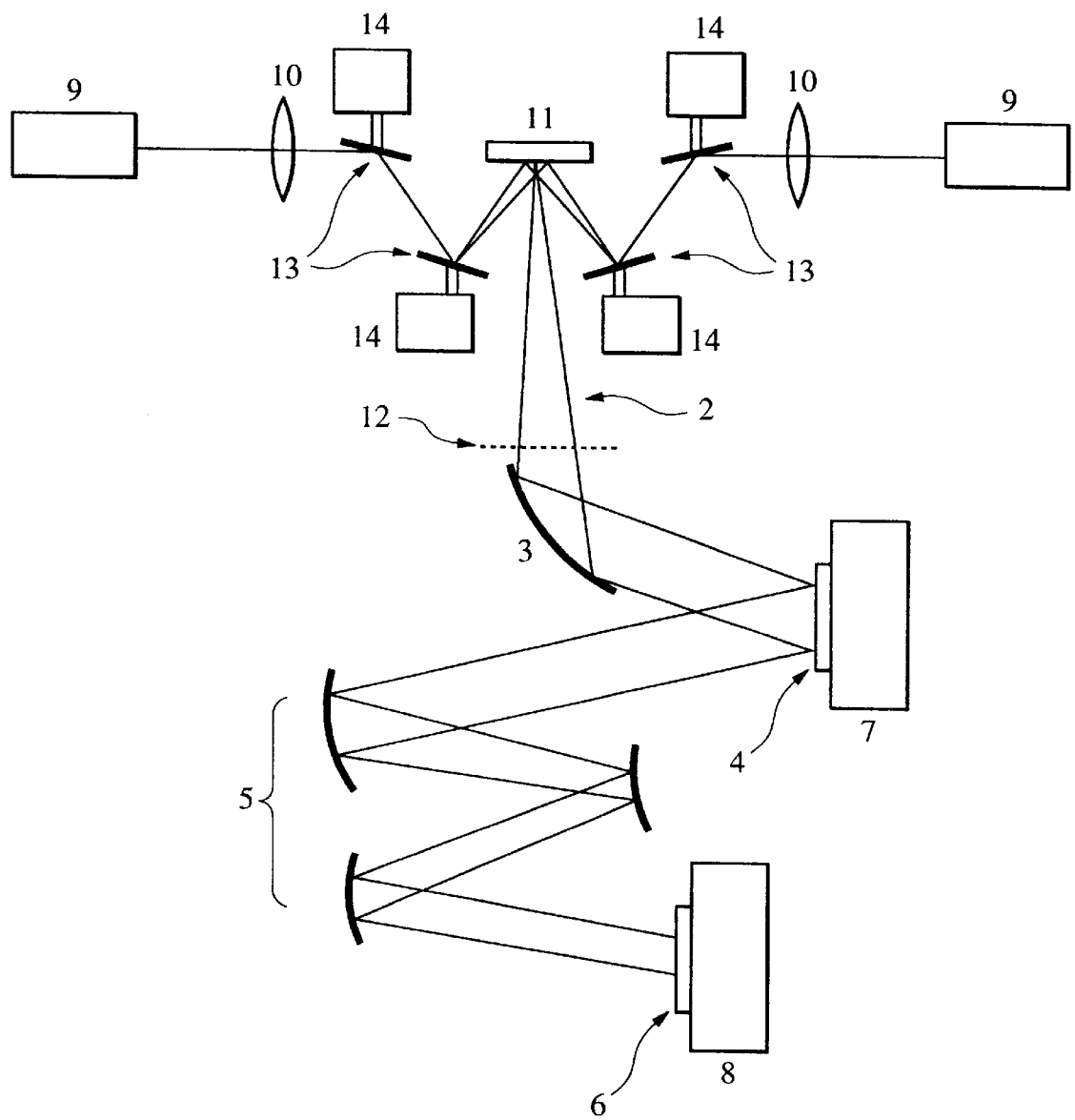
FIG. 5 is a diagrammatic illustration of a third embodiment of the present invention.

FIG. 5 shows the construction of a third embodiment. The third embodiment is basically a combination of the first embodiment shown in FIG. 1 and the second embodiment shown in FIG. 3 and, therefore, features the use of a plurality of combinations of the laser source and the laser beam deflectors. In this embodiment, each laser source 9 is provided with a pair of laser beam deflection mirrors 13 (composed of a pair of reflection mirrors). The deflection mirrors 13 are controlled by respective actuators 14.

Laser beams from the respective laser sources 9 are focused on the target 11 through respective laser beam focusing optical systems 10 each having zooming and defocusing functions, thus generating high-temperature plasmas each of which generates X-rays. The size, number and the positions of the luminescent points created by each laser can freely be controlled so as to provide any desired form of the luminescent portion of the X-ray source. In this embodiment, projection optical system 5 includes three reflective mirrors, two of which are concave and one of which is convex relative to the incident light beams.

Thus, the third embodiment employs a plurality of laser sources and the laser beams from these laser sources are independently deflected to impinge upon the target. It is therefore possible to increase the number of the luminescent points created per unit time and, hence, to increase the rate of generation of X-rays from the whole X-ray source, thus shortening the exposure time and improving the throughput.

<Fourth Embodiment>

Figure 6:
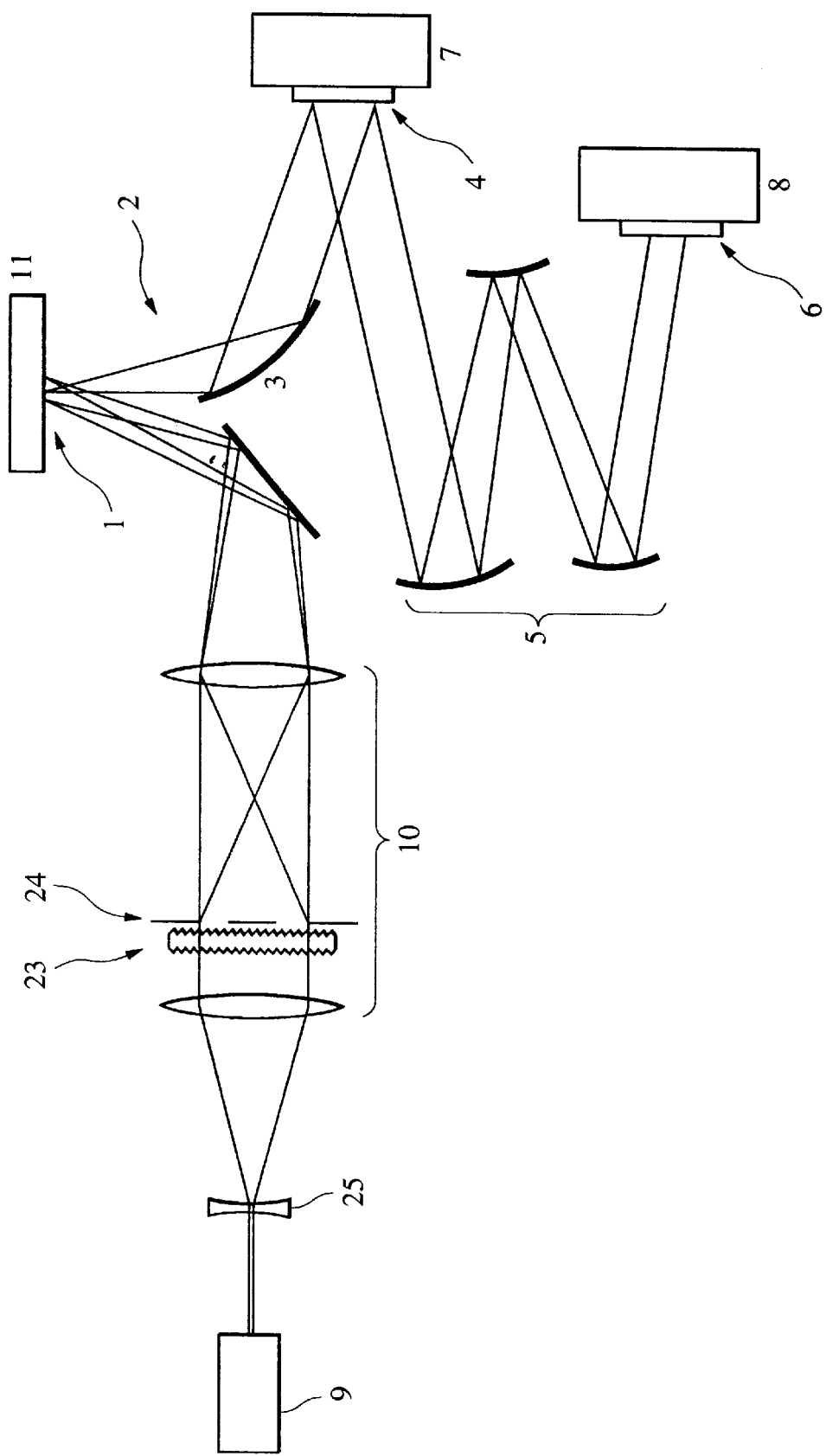
FIG. 6 is a diagrammatic illustration of a fourth embodiment of the present invention.

Referring to FIG. 6, a fourth embodiment of the present invention features the use of a focusing optical system 10 that includes an optical integrator 23, e.g., a fly-eye lens, serving as a secondary light source and an aperture 24 having a variable or selectable aperture configuration for determining the configuration of the secondary light source. A divergent lens 25 is provided before aperture 24. The image of the aperture 24 is projected onto the target 11. It is therefore possible to control the form of the luminescent portions of the laser plasmas, e.g., configuration, size and position, by selecting the configuration of the aperture 24.

Figure 7:
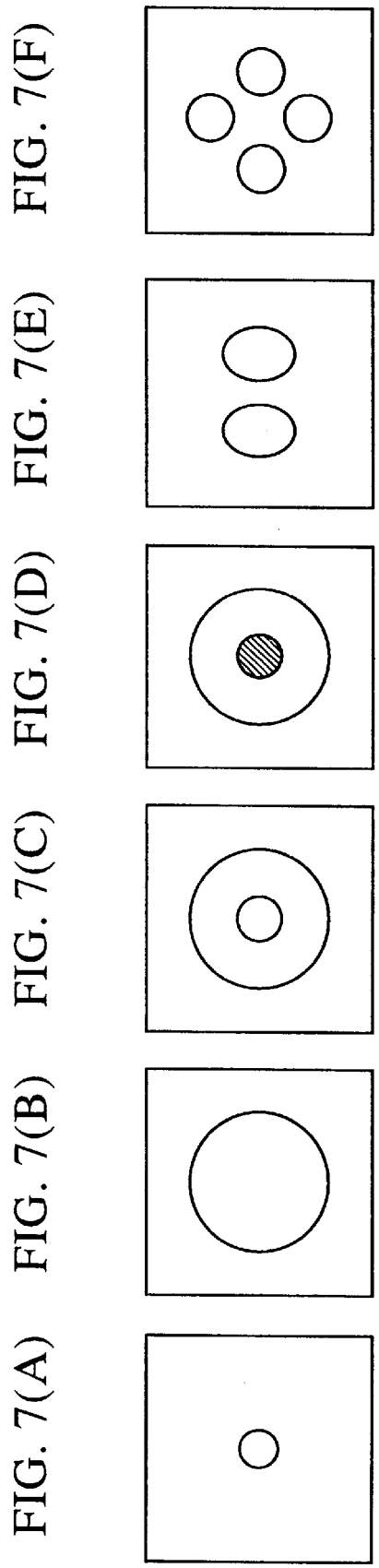
FIGS. 7(A) to 7(F) are illustrations of different configurations of apertures of an X-ray source.

FIGS. 7(A) to 7(E) show, by way of examples, different configurations of the aperture 24. FIG. 7(A) shows a simple circular aperture configuration which provides a circular luminescent portion of a finite size. A reduction in the aperture size causes a corresponding reduction in the size of the luminescent portion, offering a condition approximating that of coherent illumination. Conversely, a greater aperture size as shown in FIG. 7(B) provides a greater size of the luminescent portion, realizing a condition approximating that of incoherent illumination. A doughnut-shaped aperture as shown in FIG. 7(C) provides a ring-shaped luminescent point of a finite size, thus realizing ring illumination. FIG. 7(D) also shows a doughnut-shaped aperture, but the transmissivity of the central island is reduced. FIGS. 7(E) and 7(F) show apertures formed of a plurality of openings which provide a plurality of luminescent points to provide a modified illumination such as oblique illumination.

Although the first to fourth embodiments have been described on an assumption that the projection is performed under Köhler's-illumination conditions, it is not essential that Köhler's-illumination conditions are perfectly met. The advantages of the first to fourth embodiments are enjoyable when the illuminating conditions approximate those of Köhler's illumination. It is to be noted, however, when the illumination is conducted under conditions similar to critical illumination, illuminance distribution on the mask is rendered non-uniform, because the angular distribution of the X-ray beams illuminating the mask deviates from the intended distribution pattern and because the X-ray intensity distribution developed on the mask surface follows the spatial distribution of the luminescent points. It is therefore preferred that the illumination is conducted under conditions approximating those of Köhler's illumination.

<Fifth Embodiment>

A description will now be given of an embodiment of a device production method in accordance with the present invention.

Figure 8:
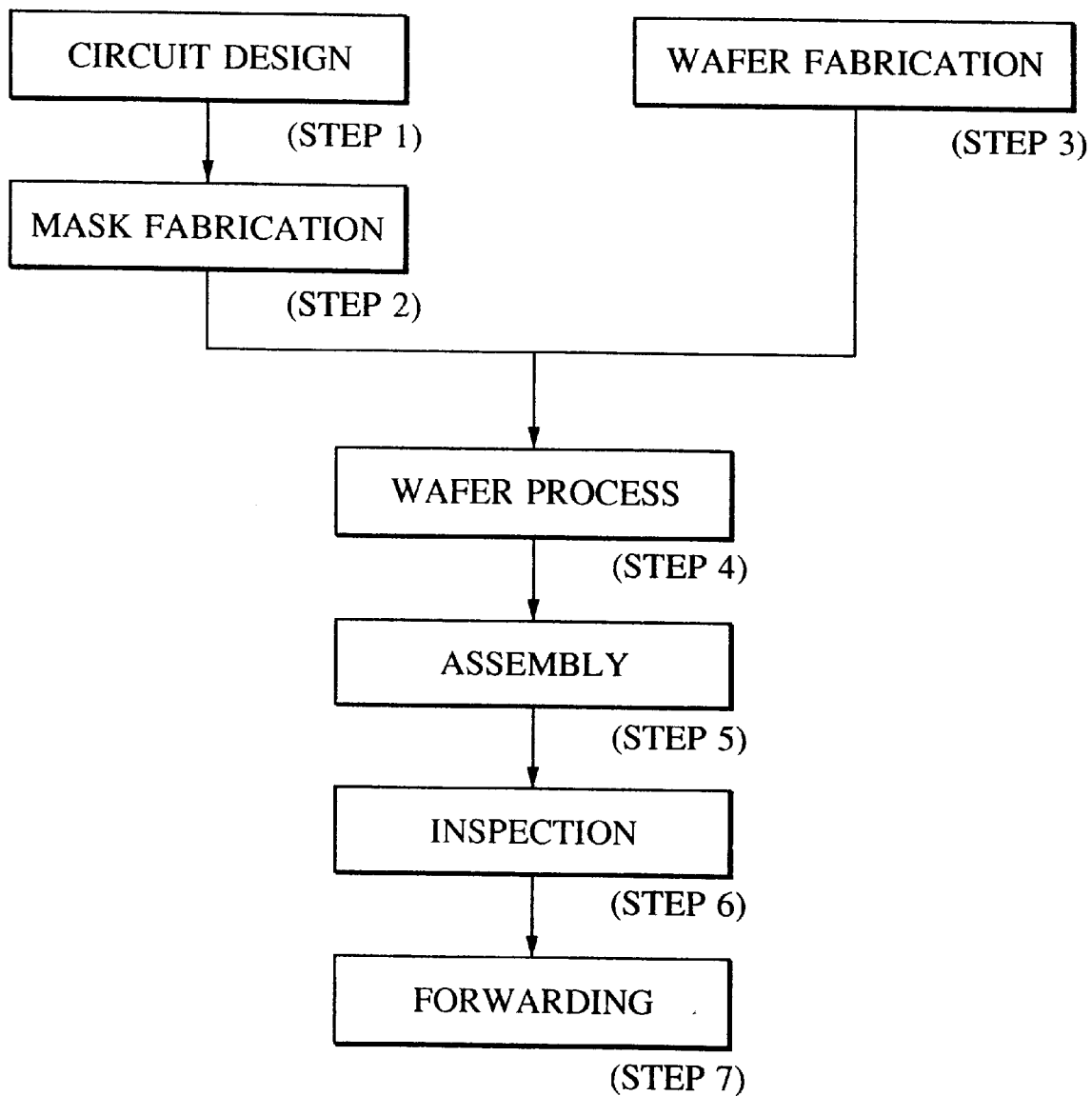
FIG. 8 is a flowchart showing a process for manufacturing a device such as a semiconductor device.

FIG. 8 is a flowchart illustrating a process for producing a microfine device such as, for example, a semiconductor chip, e.g., an IC or an LSI, a liquid crystal panel, a CCD, a thin-film magnetic head, a micromachine or the like. Step 1 (circuit design) executes designing of a semiconductor device, and Step 2 (mask fabrication) executes fabrication of a mask having a circuit pattern according to the designed circuit. In the meantime, a wafer is fabricated from a material such a silicon, in Step 3 (wafer fabrication). Step 4 (wafer process), which also is referred to as a pre-process, performs a lithographic process to form an actual circuit on the wafer by using the mask. Step 5 (assembly), also referred to as a "post-process" is a step for forming semiconductor chips by using the wafer having circuits formed thereon. Step 5 thus includes an assembly sub-step (dicing and bonding), a packaging sub-step (sealing of chips), and so forth. Step 6 (inspection) executes inspection or examination of the semiconductor device produced through Step 5, such as a test for confirming safe operation, an endurance test, and so forth. The semiconductor devices thus produced and tested are forwarded in Step 7.

Figure 9:
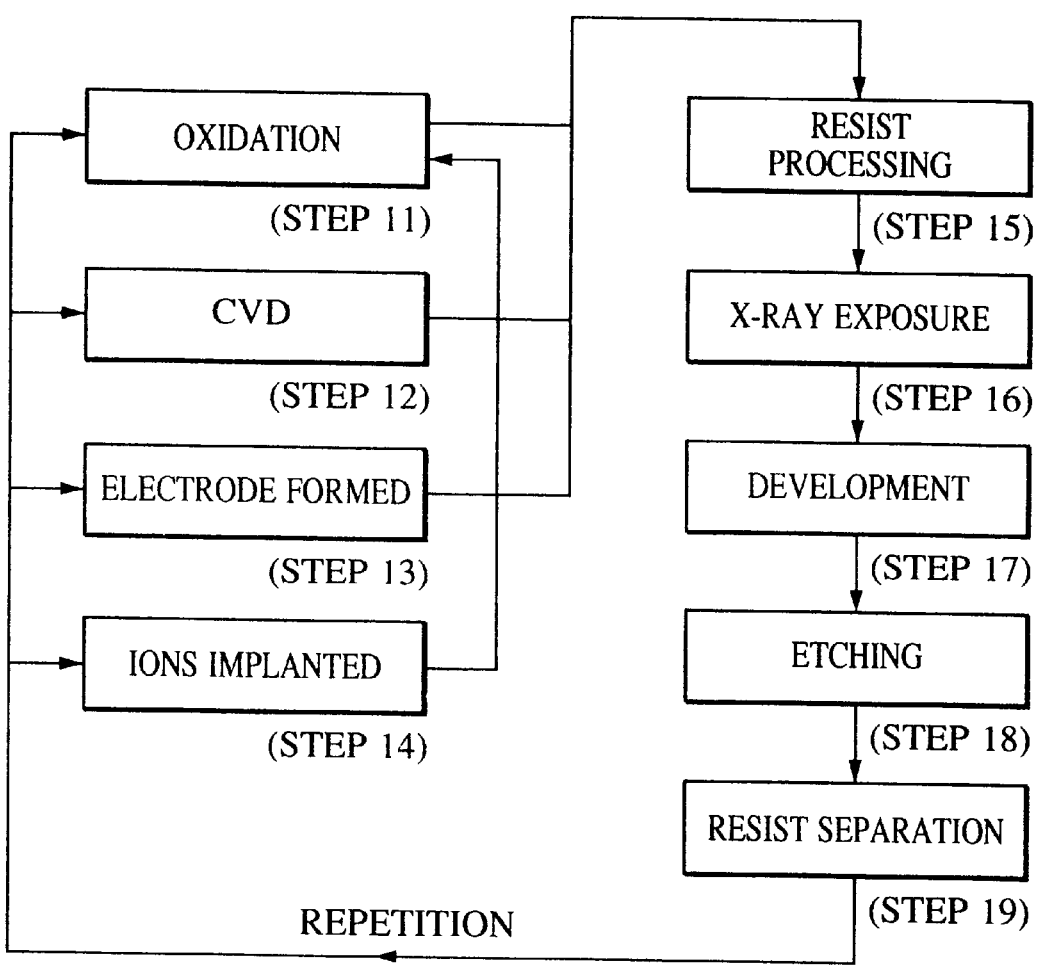
FIG. 9 is a flowchart showing the details of a wafer manufacturing process.
Figure 10:
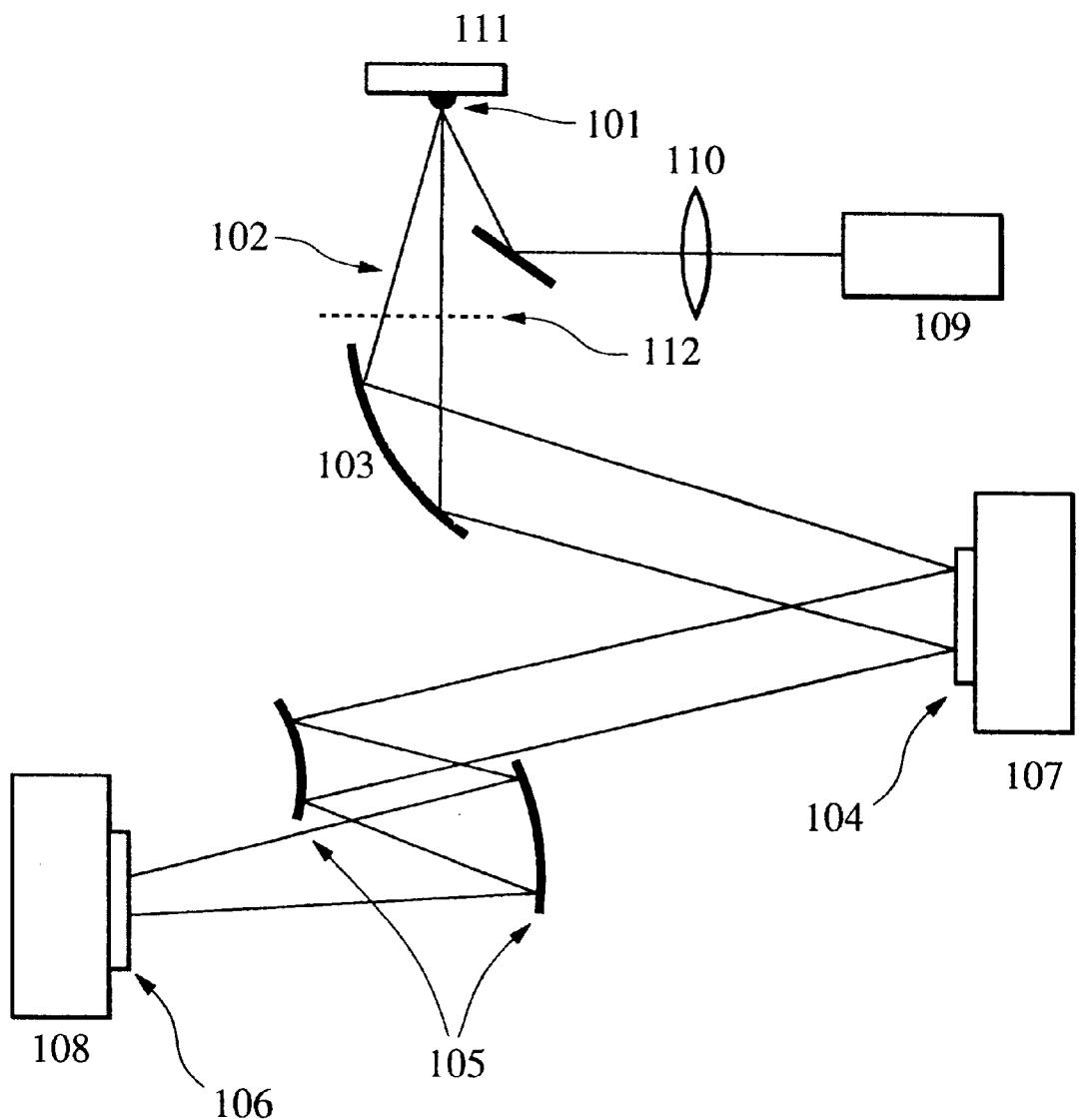
FIG. 10 is a diagrammatic illustration of a conventional X-ray demagnification projecting exposure apparatus.

FIG. 9 is a flowchart showing the details of the wafer process (Step 4 in FIG. 8). Step 11 (oxidation) performs oxidation of the wafer surface. Step 12 (chemical vapor deposition-CVD) forms an insulating film on the wafer surface. Step 13 (electrode formation) forms electrodes on the wafer by an evaporation technique. Step 14 (ion implantation) executes implantation of ions into the wafer. Step 15 (resist processing) applies a photosensitive resist on the wafer. Step 16 (exposure) prints the circuit pattern carried by the mask onto the wafer through exposure by using the exposure apparatus of one of the described embodiments. The circuit pattern formed through the exposure is developed in Step 17 (development). In Step 18 (etching), an etching is executed to remove the portions other than the developed resist image. Step 19 (resist separation) removes any of the resist which has become unnecessary after the etching. The described steps are cyclically repeated so that a multiplexed circuit pattern is formed on the wafer.

The described embodiment of the production method in accordance with the present invention enables inexpensive production of semiconductor devices which have a large scale of integration and, hence, could not easily be produced by conventional methods.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An X-ray generating device for use with an X-ray projection optical system having X-ray mirrors for projecting an image of an irradiated first object to a second object, said device comprising:

a laser source for generating a laser beam;

a target having a plurality of points for receiving the laser beam, the plurality of points forming a plurality of high temperature plasma portions, each of which generates an X-ray beam; and an illuminating optical system for irradiating an object with the X-ray beams from the high temperature plasma portions substantially under Köhler's illumination condition.

2. An X-ray generating device according to claim 1, wherein the plurality of points are non-uniformly distributed.

3. An X-ray generating device according to claim 1, wherein the plurality of points are distributed in a distribution pattern such that the distribution density is lower in a central region than in a peripherals region.

4. An X-ray generating device for use with an X-ray projection optical system having X-ray mirrors for projecting an image of an irradiated first object to a second object, said device comprising:

a laser source for generating a laser beam;

an aperture, having a variable shape, for receiving the laser beam and for defining a shape of a secondary light source;

a target for receiving the laser beam and for generating X-rays from portions of high temperature plasma on the target; and an illuminating optical system for irradiating an object with the X-ray beams from the high temperature plasma portions substantially under Köhler's illumination condition.

5. An X-ray generating device according to claim 4, wherein said variable aperture controls at least one of the configuration, size, position and number of the portions of the laser plasma on the target.

6. An X-ray projection apparatus comprising:

(i) an X-ray generating device comprising:
   a laser source for generating a laser beam; and
   a target having a plurality of points for receiving the laser beam, the plurality of points forming a plurality of high temperature plasma portions, each of which generates an X-ray beam;

(ii) irradiating means for irradiating a first object with the plurality of X-ray beams generated by said X-ray generating device; and (iii) an X-ray projection optical system having X-ray mirrors for projecting an image of the irradiated first object to a second object.

7. An X-ray irradiating apparatus according to claim 6, wherein the plurality of points are non-uniformly distributed.

8. An X-ray irradiating apparatus according to claim 6, wherein the plurality of points are distributed in a distribution pattern such that the distribution density is lower in a central region than in a peripheral region.

9. An X-ray irradiating apparatus according to claim 6, wherein said irradiating means irradiates the object substantially under Köhler's illumination conditions.

10. An X-ray irradiating apparatus according to claim 6, further comprising optical means for projecting an image of a pattern carried by the irradiated mask onto a wafer.

11. An X-ray irradiating apparatus according to claim 10, wherein said optical means comprises a demagnifying image forming optical system.

12. An X-ray projection apparatus comprising:

(i) an X-ray generating device comprising:
   a laser source for generating a laser beam;
   an aperture, having a variable shape, for receiving the laser beam and for defining a shape of a secondary light source; and
   a target for receiving the laser beam and for generating X-rays from portions of high temperature plasma on the target;

(ii) irradiating means for irradiating an object with the X-rays generated by said X-ray generating device; and (iii) an X-ray projection optical system having X-ray mirrors for projecting an image of the irradiated first object to a second object.

13. An X-ray irradiating apparatus according to claim 12, wherein said variable aperture controls at least one of the configuration, size, position and number of the portions of the laser plasma on the target.

14. An X-ray irradiating apparatus according to claim 12, wherein said irradiating means irradiates the object substantially under Köhler's illumination conditions.

15. An X-ray irradiating apparatus according to claim 12, further comprising optical means for projecting an image of a pattern carried by the irradiated mask onto a wafer.

16. An X-ray irradiating apparatus according to claim 15, wherein said optical means comprises a demagnifying image forming optical system.

17. An X-ray generating method for use with an X-ray projection optical system having X-ray mirrors for projecting an image of an irradiated first object to a second object, said method comprising:

generating at least one laser beam from at least one laser source;

providing a target having a plurality of points for receiving the at least one laser beam;

forming, from the plurality of points, a plurality of high temperature plasma portions;

generating X-ray beams from each of the high temperature plasma portions; and irradiating an object with the X-ray beams from the high temperature plasma portions substantially under Köhler's illumination condition.

18. An X-ray generating method according to claim 17, wherein the plurality of points are non-uniformly distributed.

19. An X-ray generating method according to claim 17, wherein the plurality of points are distributed in a distribution pattern such that the distribution density is lower in central region than in a peripheral region.

20. An X-ray generating method according to claim 17, further comprising deflecting the at least one laser beam to the plurality of the points.

21. An X-ray generating method according to claim 17, further comprising effecting incoherent illumination of an object with the X-rays from the portions.

22. An X-ray generating method for use with an X-ray projection optical system having X-ray mirrors for projecting an image of an irradiated first object to a second object, said method comprising:

generating a laser beam from a laser source;

providing an aperture, having a variable shape, for receiving the laser beam and for defining a shape of a secondary light source;

providing a target for receiving the laser beam;

generating X-rays from portions of high temperature plasma on the target; and irradiating an object with the X-ray beams from the high temperature plasma portions substantially under Köhler's illumination condition.

23. An X-ray generating method according to claim 22, further comprising applying the secondary laser beam to the target in a time series manner.

24. An X-ray generating method according to claim 22, further comprising controlling, using the variable aperture, at least one of the configuration, size, position and number of the portions of the laser plasma on the target.

25. An X-ray generating method according to claim 22, further comprising deflecting the at least one laser beam to the plurality of the points.

26. An X-ray generating method according to claim 22, further comprising varying the form of the portions by varying the shape of the variable aperture.

27. An X-ray generating method according to claim 26, further comprising effecting incoherent illumination of an object with X-rays from the portions.

28. A method of producing a semiconductor device, said method comprising the steps of:

generating at least one laser beam from at least one laser source;

providing a target having a plurality of points of high temperature plasma for receiving the at least one laser beam;

forming, from the plurality of points, a plurality of high temperature plasma portions;

generating X-ray beams from each of the high temperature plasma portions;

irradiating a mask with the X-rays generated from the high temperature plasma portions; and projecting an image of a pattern carried by the irradiated mask onto a semiconductor wafer to produce a semiconductor device.

29. A semiconductor device production method according to claim 28, wherein the plurality of points are non-uniformly distributed.

30. A semiconductor device production method according to claim 28, wherein the plurality of points are distributed in a distribution pattern such that the distribution density is lower in a central region than in a peripheral region.

31. A semiconductor device production method according to claim 28, further comprising deflecting the at least one laser beam to the plurality of points.

32. A semiconductor device production method according to claim 28, further comprising effecting incoherent illumination of the mask with the X-rays from the portions.

33. A semiconductor device production method according to claim 28, wherein said irradiating step comprises focusing the X-rays from the points onto the mask so as to effect Köhler's illumination of the mask.

34. A semiconductor device production method according to claim 28, wherein said irradiating step comprises causing the X-rays from the points to impinge on the mask at different angles.

35. A semiconductor device production method according to claim 34, further comprising changing the angular distribution of the X-rays, impinging on the mask.

36. A method of producing a semiconductor device, said method comprising the steps of:

generating a laser beam from a laser source;

providing an aperture, having a variable shape, for receiving the laser beam and for defining a shape of a secondary light source;

providing a target for receiving the laser beam;

generating X-rays from portions of high temperature plasma on the target;

irradiating a mask with the X-rays generated from the high temperature plasma portions; and projecting an image of a pattern carried by the irradiated mask onto a semiconductor wafer to produce a semiconductor device.

37. A semiconductor device production method according to claim 36, further comprising applying the laser beam to the target in a time series manner.

38. A semiconductor device production method according to claim 36, further comprising controlling, using the variable aperture, at least one of the configuration, size, position and number of the portions of the laser plasma, on the target.

39. A semiconductor device production method according to claim 36, further comprising deflecting the at least one laser beam to the plurality of points.

40. A semiconductor device production method according to claim 36, further comprising varying the form of the portions by varying the shape of the variable aperture.

41. A semiconductor device production method according to claim 40, further comprising effecting incoherent illumination of the mask with X-rays from the portions.

42. A semiconductor device production method according to claim 36, wherein said irradiating step comprises focusing the X-rays from the points onto the mask so as to effect Köhler's illumination of the mask.

43. A semiconductor device production method according to claim 36, wherein said irradiating step comprises causing the X-rays from the points to impinge on the mask at different angles.

44. A semiconductor device production method according to claim 36, further comprising changing the angular distribution of the X-rays impinging on the mask.

45. An X-ray exposure apparatus comprising:

laser source means for generating at least one laser beam;

a target having a plurality of points for receiving the at least one laser beam, the plurality of points forming a plurality of high temperature plasma portions simultaneously, each of which generates an X-ray beam; and an X-ray projection optical system having X-ray mirrors for projecting an image of an irradiated first object to a second object by the X-ray beams generated by the plurality of high temperature plasma portions, wherein the X-ray beams from the plurality of high temperature plasma portions are irradiated on the first object simultaneously.

* * * * *

UNITED STATES PATENT AND TRADEMARK OFFICE
CERTIFICATE OF CORRECTION

PATENT NO. : 6,038,279

DATED : March 14, 2000

INVENTORS : AKIRA MIYAKE, ET AL.

It is certified that error appears in the above-identified patent and that said Letters Patent is hereby corrected as shown below:

COLUMN 1:
Line 33, "t he" should read --the--.

COLUMN 2:
Line 49, "K" should be deleted; and
Line 50, "öhler's-illumination" should read --Köhler's-illumination--.

COLUMN 8:
Line 47, "K" should be deleted; and
Line 48, "öhler's-illumination" should read --Köhler's-illumination--.

COLUMN 10:
Line 9, "peripherals" should read --peripheral--;
Line 43, "irradiating" should read --projection--;
Line 46, "irradiating" should read --projection--;
Line 50, "irradiating" should read --projection--;
Line 53, "irradiating" should read --projection--; and
Line 56, "irradiating" should read --projection--.

UNITED STATES PATENT AND TRADEMARK OFFICE
CERTIFICATE OF CORRECTION

PATENT NO. : 6,038,279

DATED : March 14, 2000

INVENTORS : AKIRA MIYAKE, ET AL.

It is certified that error appears in the above-identified patent and that said Letters Patent is hereby corrected as shown below:

COLUMN 11:
Line 6, "irradiating" should read --projection--;
Line 10, "irradiating" should read --projection--;
Line 13, "irradiating" should read --projection--;
Line 16, "irradiating" should read --projection--;
Line 33, "K" should read --Köhler's--;
Line 34, "öhler's" should be deleted--;
Line 61, "K" should read --Köhler's--; and
Line 62, "öhler's" should be deleted.

COLUMN 12:
Line 44, "K" should read --Köhler's--; and
Line 45, "öhler's" should be deleted--.

UNITED STATES PATENT AND TRADEMARK OFFICE
CERTIFICATE OF CORRECTION

PATENT NO. : 6,038,279

DATED : March 14, 2000

INVENTORS : AKIRA MIYAKE, ET AL.

It is certified that error appears in the above-identified patent and that said Letters Patent is hereby corrected as shown below:

COLUMN 13:
Line 19, "K" should read --Köhler's--; and
Line 20, "Köhler's" should be deleted.

Signed and Sealed this

Twenty-seventh Day of March, 2001

Attest:

NICHOLAS P. GODICI

Attesting Officer

Acting Director of the United States Patent and Trademark Office